United States Patent [19]

Hennessey et al.

[11] Patent Number: 5,696,835
[45] Date of Patent: Dec. 9, 1997

[54] APPARATUS AND METHOD FOR ALIGNING AND MEASURING MISREGISTRATION

[75] Inventors: A. Kathleen Hennessey; YouLing Lin; Wan Sang Wong; C. Rinn Cleavelin, all of Lubbock; Stephen J. Demoor, Sugarland, all of Tex.; Kwang-Soo Hahn, Seoul, Rep. of Korea

[73] Assignees: Texas Instruments Incorporated, Dallas; Texas Tech University, Lubbock, both of Tex.

[21] Appl. No.: 603,026

[22] Filed: Feb. 16, 1996

Related U.S. Application Data

[63] Continuation of Ser. No. 186,691, Jan. 21, 1994, abandoned.
[51] Int. Cl.$^6$ ..................................... G06K 9/00
[52] U.S. Cl. .................. 382/141; 382/151; 382/218; 348/86; 348/87; 348/94; 348/95
[58] Field of Search ..................... 382/151, 141, 382/218; 364/491; 348/86, 87, 94, 95

[56] References Cited

U.S. PATENT DOCUMENTS

| | | | |
|---|---|---|---|
| 4,233,625 | 11/1980 | Altman | 382/8 |
| 4,353,087 | 10/1982 | Berry et al. | 348/87 |
| 4,550,374 | 10/1985 | Meshman et al. | 348/95 |
| 4,641,257 | 2/1987 | Ayata | 348/95 |
| 4,791,586 | 12/1988 | Maeda et al. | 364/491 |
| 4,794,648 | 12/1988 | Ayata et al. | 382/8 |
| 5,109,430 | 4/1992 | Nishihara et al. | 382/8 |

OTHER PUBLICATIONS

Kwang–Soo Hahn, "Investigation of a Fuzzy Grammar for Automated Visual Inspection"—Dissertation in Interdisciplinary Engineering, Graduate Faculty, Texas Tech University, Aug. 1989.

YouLing Lin, "Techniques for Syntactic Analysis of Images with Application for automatic Visual Inspection"—Dissertation in Business Administration, Graduate Faculty, Texas Tech University, Dec., 1990.

*Primary Examiner*—Jose L. Couso
*Assistant Examiner*—Anh Hong Do
*Attorney, Agent, or Firm*—Robert L. Troike; W. James Brady, III; Richard L. Donaldson

[57] ABSTRACT

A method is provided for aligning a silicon wafer (20) in a fabrication tool (37) having a stage (22) involving the steps of producing a digital image of a portion of wafer (20) in a scope-of-view window (48), converting the digital image to image primitives, comparing the image primitives to grammar template primitives to locate a known intersection on wafer (20); and moving the stage (22) to align wafer (20). A method and apparatus are disclosed for determining the misregistration of two layers of a wafer (20) by converting targets (158, 160) to primitives and determining the relative displacement in symbolic space. The misregistration apparatus involves a camera (34), a video-to-digital converter (32), a computer (28), and a stage adjuster (24).

3 Claims, 6 Drawing Sheets

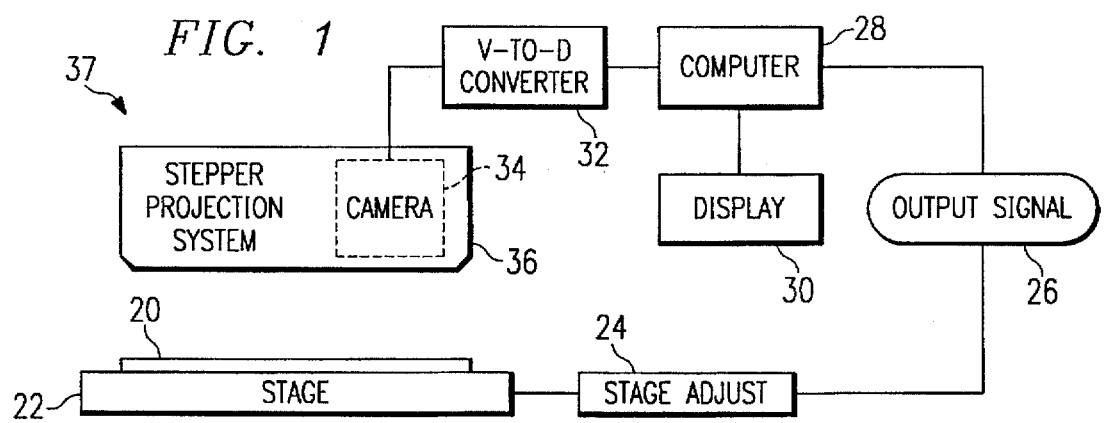
FIG. 1
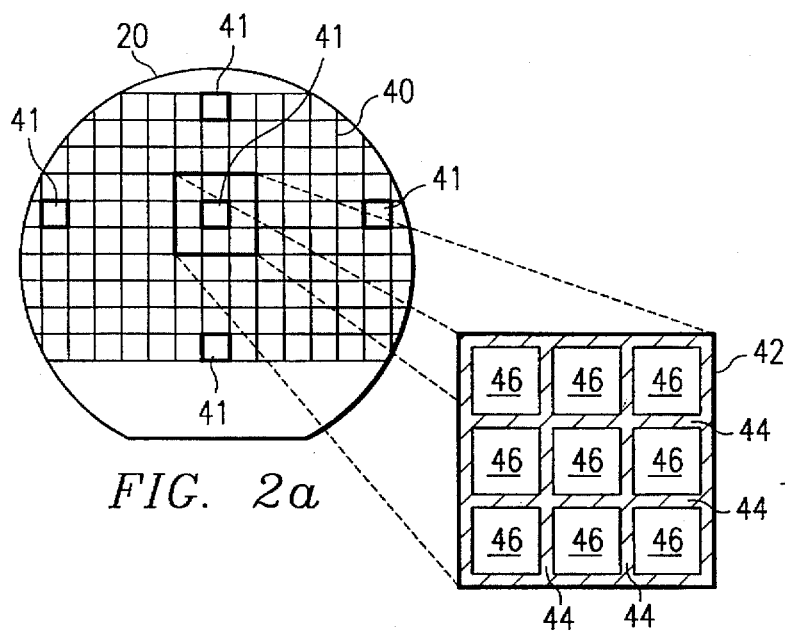
FIG. 2a
FIG. 2b
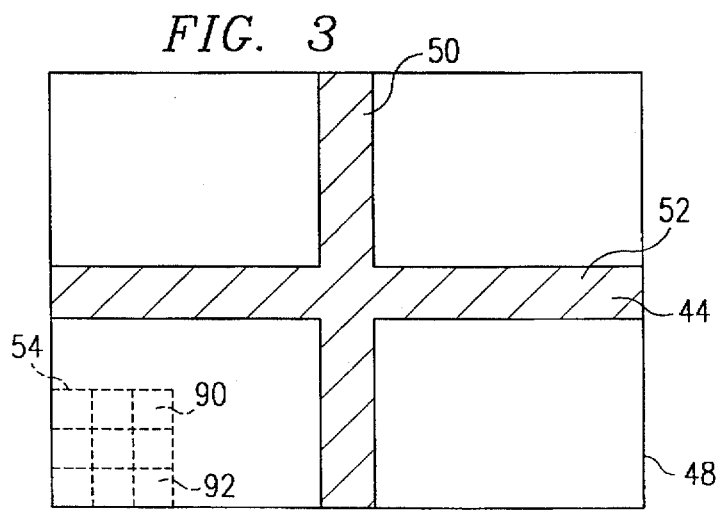
FIG. 3

APPARATUS AND METHOD FOR ALIGNING AND MEASURING MISREGISTRATION

This application is a Continuation of application Ser. No. 08/186,691, filed Jan. 21, 1994, now abandoned.

RELATED APPLICATION

This application is related to U.S. patent application Ser. No. 08/186,750 filed Jan. 21, 1994, now U.S. Pat. No. 5,515,453, entitled Apparatus and Method for Image Processing in Symbolic Space, incorporated herein by reference (Attorney's Docket TI-18716).

TECHNICAL FIELD OF THE INVENTION

This invention relates to imaging, and more particularly relates to aligning and measuring misregistration of layers associated with the fabrication of an integrated circuit.

BACKGROUND OF THE INVENTION

The production of integrated circuits may be divided into two basic phases: (1) the design phase and (2) the fabrication phase. During the design phase, the circuits are designed according to the desired functions and the components needed to implement the functions are chosen. Each logic component is designed from connecting components such as transistors. Once the initial design phase is completed, the circuit is laid out in a series of patterns to be transferred to a silicon wafer. The patterns correspond to the device regions or interconnect structures. The patterns are typically sequentially transferred to the silicon wafers through a photolithographic process with a set of masks or reticles and a step-and-repeat projection system ("stepper"). Each pattern transfer step creates a new set of features (sometimes referred to as "layers") on the wafer surface.

The photolithographic process typically requires that layers of photoresist material be first spin-coated onto the wafer substrate, and then the resist layer is selectively exposed to a form of electromagnetic radiation, which is frequently ultraviolet light. The patterns on the resist are formed when the wafer subsequently undergoes a "development" step. After development, the areas containing photoresist will protect the underlying substrate while areas from which the photoresist has been removed may be subject to a variety of processes, e.g., etching or lift-off.

After the photoresist is applied to the substrate, the wafer is exposed through a mask or reticle. The mask contains opaque and clear features that may define the circuit pattern to be created in the respective photoresist layer of the wafer. The alignment of the optical pattern to be transferred to the wafer is one of the most critical steps in the lithography process; in fact, machines for transferring the patterns are frequently referred to as "aligners" for this reason. Integrated circuits are fabricated by patterning a sequence of layers on the wafer with the layers bearing spatial relationships to one another. Thus, each layer or level in the fabrication process must be aligned to the previous layer.

In initially aligning a wafer and aligning one layer to another, special alignment patterns may be designed onto each mask level and used for alignment. It is frequently assumed that when these alignment patterns on each layer are aligned, the remaining portion of the circuit patterns will likewise be aligned. This alignment of the alignment patterns for each layer was originally performed by human operators who used microscopes to position the mask in alignment with the wafer patterns. Automatic alignment systems have since been designed.

One conventional technique for automatic alignment is to place two rectangular patterns oriented 90 degrees from each other and spaced so that each line is generally at a 45 degree angle to the direction of the motion of the stage, which is a moveable platform on which the wafer resides during processing by a tool. The rectangular patterns may be etched on the wafer. Two corresponding rectangular patterns are placed on the reticle, and the reticle patterns are projected onto the wafer. The superimposed alignment target and the reticle image are reflected back into the main optical element of the aligner and then into an on-axis microscope. The image from the microscope may be converted to a video image by a camera and then to a digital image to be analyzed by a computer. A shortcoming of this method includes process variations in placing the superimposed target on the wafer resulting in alignment variations because an etched edge for example may have a defect that causes the scan of the marks to be deflected differently, i.e. the surface may not be oriented as intended so that the images are not reflected back properly.

Another shortcoming results from the computer and memory requirements for this technique. Analyzing the digitized information has involved storing a bit map for the digitized image (pixel by pixel) and performing operations on the entire bit map. This process is very computer memory intensive and has required large computers to accomplish. For example, a KLA 2030 computer might be used with a 500×500 pixel array storing the image and might require as much as 2.5 seconds to process.

Alignment techniques are used with steppers, and with many other types of equipment used in the fabrication of integrated circuits. Alignment techniques are also used in a wide variety of manufacturing and assembly processes. Metrology tools are frequently used in fabrication processes. For example, a metrology tool may be used to determine the registration of a given layer, and then the displacement or offset may be entered into the stepper before the remaining wafers of a given lot are processed. In the past, this might be accomplished by using verniers that are read by a human or a machine.

SUMMARY OF THE INVENTION

In accordance to an aspect of the present invention, an apparatus and method for aligning wafers for fabrication or to check registration of the wafer are provided that eliminate or substantially reduce the disadvantages and shortcomings of the previous techniques and systems. According to an aspect of the present invention, a video image is converted to a digital image and then to image primitives so that the video image may be compared in symbolic space.

Primitives are the basic building blocks by which a figure may be represented with a minimum amount of information; for example, a circle could be saved as primitives, or tokens, by recording the center point and the radius. A figure represented as primitives is generally said to be in symbolic space. Saving figures as primitives saves computer memory because a minimum amount of information is necessary to represent the figure as compared to the information required for a pixel-by-pixel representation of the figure.

According to one aspect of the present invention, a wafer is aligned in a fabrication tool by first producing template primitives from a test wafer and then for each wafer to be aligned converting a video image to image primitives, matching the image primitives with the template primitives, determining the difference between the image primitives and template primitives in terms of rotation and displacement and producing signals to reposition the wafer for alignment.

According to another aspect of the present invention, a misregistration check between two layers of a wafer is accomplished by placing a first target on the first layer and a second target on the second layer, converting the targets to image primitives, and then determining the relative displacement between the two targets in symbolic space.

A technical advantage of the present invention is that it typically requires considerably less computer memory than conventional systems for aligning or measuring misregistration. Another technical advantage is shortened processing time for a given computer to facilitate alignment or to determine misregistration. A further technical advantage is that no new equipment is typically required to be added to the fabrication process line to align layers or measure misregistration of wafers according to the present invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a schematic representation of a system incorporating the present invention for aligning wafers containing patterns;

FIG. 2a is a schematic plan view of a wafer;

FIG. 2b is an exploded section of FIG. 2a showing scribe intersections;

FIG. 3 is a schematic plan view of one particular scribe intersection on the wafer of FIG. 2a;

DETAILED DESCRIPTION OF THE INVENTION

Figure 5:
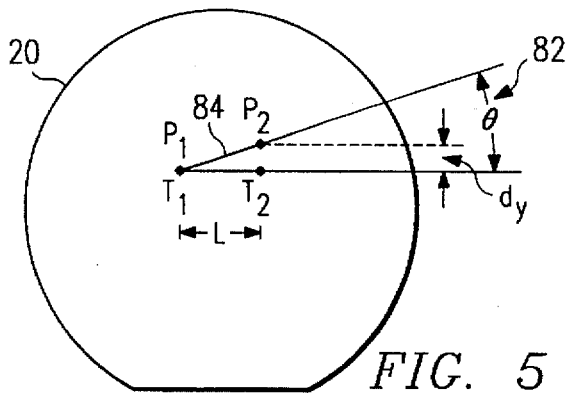
FIG. 5 is a schematic plan view of a wafer showing a skew of θ.

The present invention and its advantages are best understood by referring to FIGS. 1 through 12 of the drawings, like numerals being used for like and corresponding parts of the various drawings.

Referring to FIG. 1, there is shown a schematic representation of an alignment system that may be used in the fabrication process of integrated circuits on silicon wafers according to the present invention. A silicon wafer 20 is carried by stage 22 which is movable in conjunction with a stage adjuster 24, which is coupled to stage 22. During the alignment process, an output signal 26 is produced by computer 28, and output signal 26 may be delivered to stage adjuster 24 so as to reposition stage 22 in response to output signal 26. The substance of output signal 26 may also be displayed by computer 28 on display 30. In order to perform an alignment or misregistration check, computer 28 receives a digital image signal from video-to-digital converter 32. Video-to-digital converter 32 receives a video image signal from camera 34, which is a subsystem of the stepper projection system 36. A stepper 36 is a type of fabrication tool 37. Fabrication tools 37 are used to process wafers.

Referring now to FIG. 2a, there is shown silicon wafer 20 with a reticle layout 40 shown thereon. Exploded section 42 shown in FIG. 2b shows four scribe line segments 44 defining chips 46. Although the pattern formed by the scribe line segments shown in exploded section 42 are uniform, it is to be understood that an exploded view on most all wafers would contain unique line segments.

Referring now to FIG. 3, there is shown a scope-of-view window 48 as may be developed by camera 34 of stepper projection system 36 (FIG. 1). A similar scope-of-view window 48 may be developed by a camera associated with other types of semiconductor wafer fabrication tools. Scope-of-view window 48 shows the intersection of two scribe line segments 44, which contains a vertical line segment 50 and a horizontal line segment 52. The image shown in scope-of-view window 48 may be a digital image of the line segment intersection with a predetermined number of pixels defining scope-of-view window 48. A kernel, or kernel window 54, which is discussed in detail below, is shown at the lower lefthand corner of scope-of-view window 48.

Figure 4:
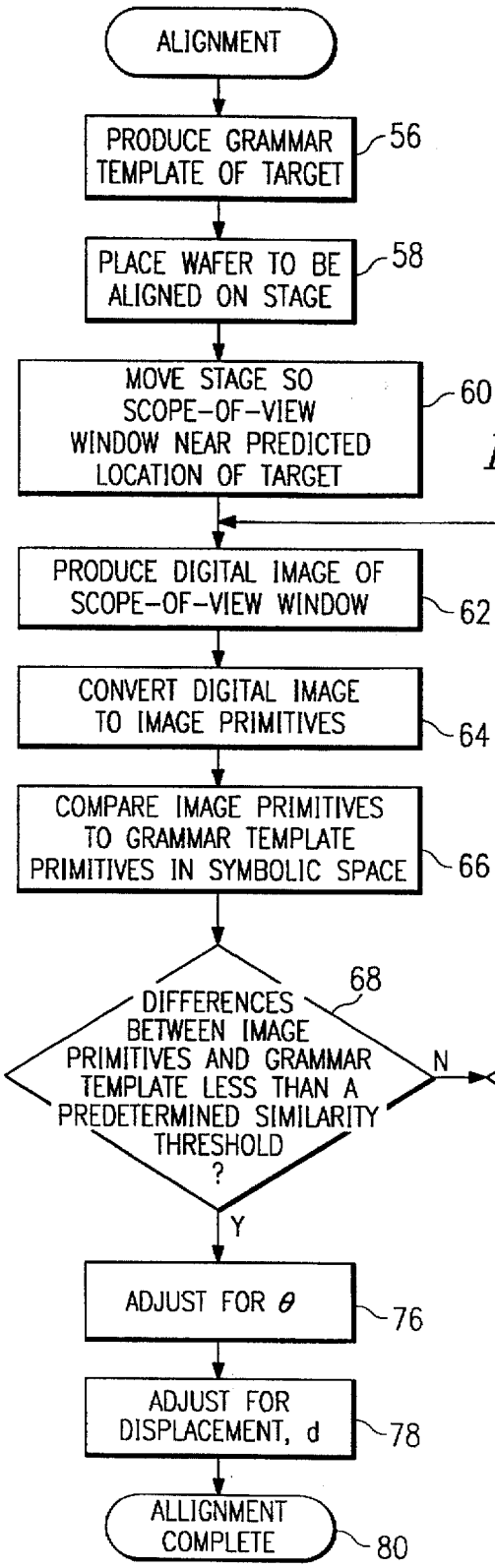
FIG. 4 is a block diagram showing the steps of one method of accomplishing one aspect of the present invention.

Referring now to FIG. 4, there is shown the steps of one method by which the present invention might be used to align a wafer in a fabrication tool such as tool 37 of FIG. 1. The first block 56 specifies that grammar template primitives of a target on wafer 20 be produced. This involves capturing a target alignment pattern on a wafer 20 for the particular device to be worked on at a given time by fabrication tool 35. Typically, in setting up a new device to be fabricated, a specific and unique intersection of scribe lines or etchings may be used as an alignment pattern or target. The pattern is captured by a camera 34 converted to a digital signal, and then converted to primitives to form grammar template primitives.

Block 58 specifies that wafer 20 to be aligned is to be placed on stage 22 of fabrication tool 37. Once wafer 20 is placed on stage 22, the alignment system that is built into or used in conjunction with tool 37 can position camera 34 of tool 37 so that a scope-of-view window 48 is centered at the estimated or predicted location of the target, e.g., scribe line 44 intersection of FIG. 3. See block 60 of FIG. 4. Stage 22 is moved to the specified location to within a predetermined scope-of-view tolerance. The specified location may be determined for a test wafer when a process is set up for a given device. While fabrication tool 37 can position scope-of-view window 48 over the target within a specified tolerance, the alignment tolerance (scope-of-view alignment tolerance) built into tool 37 is typically not as precise as desired, and therefore, the alignment system of the present invention is used to further align wafer 20 in tool 37.

The image contained in scope-of-view window 48 is converted to a digital image at block 62. This production of a digital image is accomplished by capturing a video image of the contents of scope-of-view window 48 and using a video-to-digital converter 32 to change the video image into a digital image. As will be discussed in more detail below, the digital image is then converted to image primitives at block 64. The image primitives produced at block 64 typically comprise at least two points and a magnitude or length for each line segment or a predetermined number of line segments contained in the digital image. Thus, the digital image will be represented as image primitives with a list of line segments for which at least two points and a magnitude are given.

The image primitives developed at block 64 are then compared with the grammar template primitives, which are known patterns represented as primitives produced at block 56, in order to determine whether the differences between the image primitives and the grammar template primitives are less than a predetermined similarity threshold at block 66. The comparison at block 66 is described in more detail below, but the general comparison is along the lines of taking the first image primitives that represent a line segment and comparing it to each line segment represented as a set of grammar primitives in the grammar template primitives, and computing an error function value for the comparison. Once the comparison of the image primitives is complete for each line segment in the grammar template primitives, the match with the smallest error function is considered to determine whether it is smaller than a predetermined error threshold value. If it is, a match is noted (i.e., the counter is incremented). If the number of matches after considering a plurality of the line segments is greater than a specified similarity threshold, e.g., 90% for the image primitives match grammar template primitives, the target pattern has been located and additional processing may begin. The threshold is considered at interrogatory block 68 of FIG. 4.

If the answer to interrogatory block 68 is NO, interrogatory block 70 is considered. Interrogatory block 70 asks whether more than a predetermined number of attempts to match image primitives and grammar templates have been made. If the answer to interrogatory block 70 is YES, then the search for an acceptable match is terminated and an error flag is set at termination point 72. Thus, if the target pattern is non-existent or remote from the scope-of-view window 48, the search for the target will terminate after a number of attempts to locate it. If the answer to interrogatory box 70 is negative, the scope-of-view window 48 is repositioned as specified at block 74 and blocks 62 through 68 are repeated. This procedure moves scope-of-view window 48 to where the target is predicted, searches for an adequate match of the image primitives to template primitives, and if it does not find a sufficient match, then moves scope-of-view window 48 in a predetermined search pattern (block 74) in an effort to locate the target. If a sufficient match is found, the answer to interrogatory block 68 will be in the affirmative, and the process continues to block 76.

Block 76 specifies that any rotational misalignment or skew (θ) be determined so that an appropriate output signal may be sent to stage adjuster 24 to correct the rotational misalignment. The operation of block 76 is discussed in more detail below in conjunction with FIG. 5. After adjusting for θ at block 76, the process continues to block 78 where the linear displacement, d, is determined and an appropriate output signal delivered to stage adjuster 24 to correct for linear displacement about a Y-axis and an X-axis. Having corrected for θ and d, the alignment process is complete (termination point 80). Steps 62–80 may be reiterated to further enhance alignment. Furthermore, a number of sample sites 41 (FIG. 2a) may be used to arrive at the best alignment for the wafer as a whole by determining alignment discrepancies at each site 41 and averaging the displacements to develop the necessary correction.

Referring now to FIG. 5 there is shown wafer 20 with a skew or rotational misalignment θ shown by reference numeral 82. During the alignment process discussed in conjunction with FIG. 4 above, at least two points $P_1$ and $P_2$ are found for given line segment, e.g., line segment 84. Line segment 84 is shown at an angle θ 82 from horizontal, but the proper alignment, which is determined by the template pattern, would have line 84 horizontal as shown by the line $T_1$-$T_2$. In order to determine the amount of rotational correction to be sent to stage adjuster 24, the angle θ is determined according to the equation:

$$\theta = \tan^{-1}\left(\frac{dy}{L}\right) \quad (1)$$

where L is the X-component of line segment 84 and dy is the vertical component of line segment 84.

The stepper 36 with 22 can adjust some of the skew, but due to mechanical limitations of the rotational ability of stage adjuster 24, all of θ may not be adjusted to the exact position desired. Further corrections are possible, however, according to one aspect of the present invention. Suppose, for example, the remaining skew is α, let $$V = \tan(\alpha) \quad (2)$$

then skew adjustment can be done by moving in the horizontal direction (X) and the vertical direction (Y) as follows:

$$\Delta X' = \Delta X - V \cdot \Delta Y \quad (3)$$

$$\Delta Y' = \Delta Y - V \cdot \Delta X \quad (4)$$

where $\Delta X$, $\Delta Y$ are the X axis and Y axis translations needed to move the stage to the correct position and $\Delta X'$ and $\Delta Y'$ are the values after adjustment.

Figure 6:
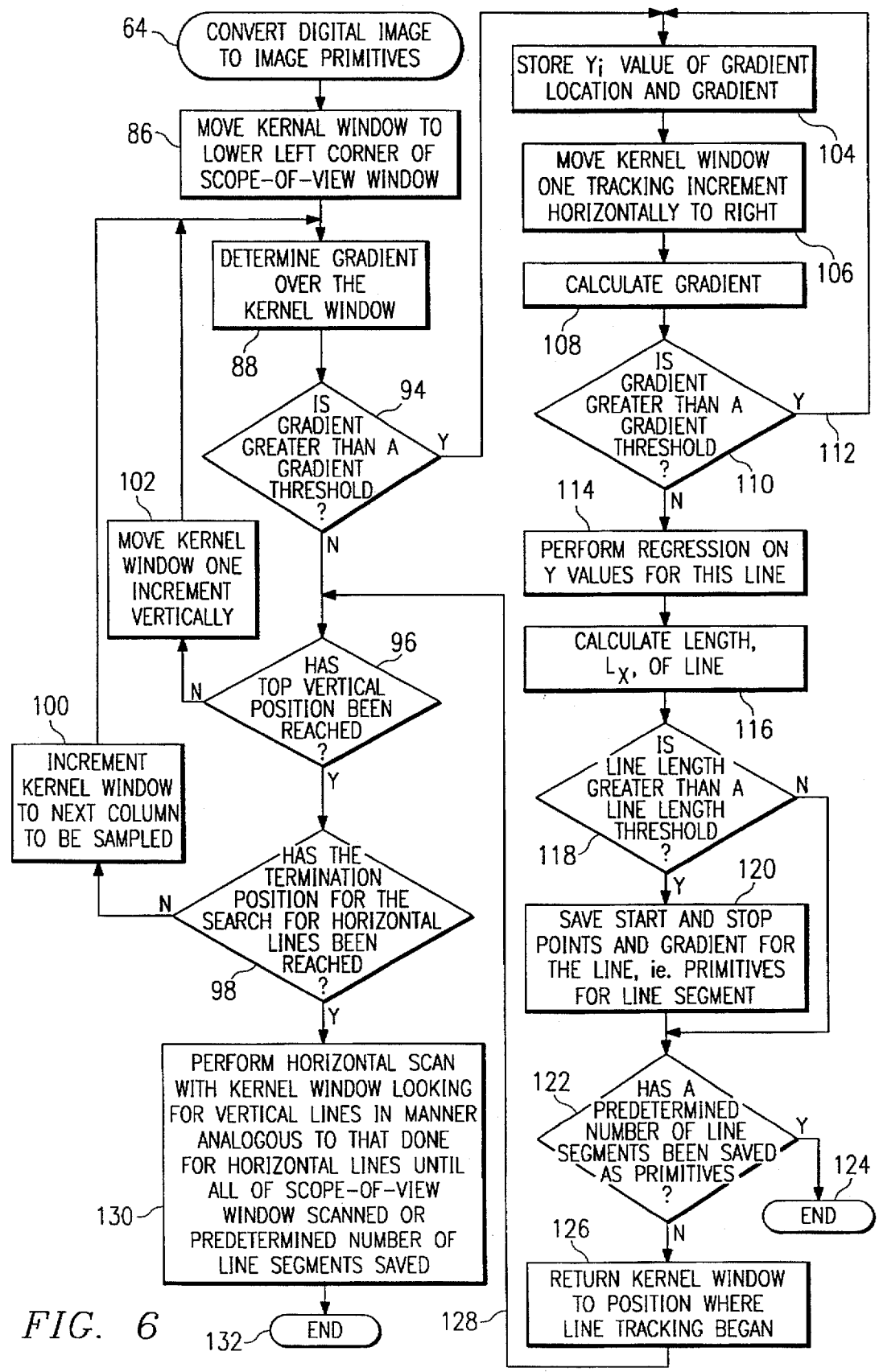
FIG. 6 is a block diagram showing one method for converting a digital image to image primitives according to the present invention.

Referring now to FIG. 6, there is shown a block diagram showing in more detail the process for converting a digital image to image primitives (block 64 of FIG. 4) according to one method of the present invention. One method is to conduct a modified Sobel search by using a kernel 54 (see FIG. 3). Kernel 54 is moved to an initial position, which may be, for example, the left lower corner of scope-of-view window 48 as indicated at block 86. It is to be understood that other known search techniques could be used. Generally, the process shown in FIG. 6 moves the kernel vertically to locate horizontal lines and then horizontally to find vertical lines, and upon finding a line, traces it and converts it to primitives before continuing to scan the window for additional lines. The search for a gradient over kernel 54 begins at block 88.

The intensity, e.g., the gray scale value, for each pixel of the digital image (FIG. 3) is stored in matrix form. The kernel 54 can evaluate whether a gradient exists across kernel window 54; as a simplified representation of how this is done, in a search for vertical lines, the top row of kernel 54 may have the intensity values added for the three boxes of row 90 (shown in FIG. 3) and the three boxes of the lower row 92 of window 54 may likewise be added. The summed intensity of rows 90 and 92 may be compared to determine the gradient that exists between row 90 and row 92. As is the subject of interrogatory block 94, the question is asked whether the gradient that exists across kernel 54 is greater than a predetermined gradient threshold. If the gradient is not greater than a predetermined gradient threshold, the process continues to interrogatory block 96.

Interrogatory block 96 asks whether the top of the scope-of-view window 48 has been reached for a given vertical path of kernel 54 about the column being considered in scope-of-view window 48. If the top vertical position has been reached, the question is asked (block 98) whether the final termination position for scope-of-view window 48 in terms of analysis for horizontal lines has been reached. If such a termination position has not been reached, block 100 calls for the kernel to be incremented or repositioned to the next column at the bottom of scope-of-view window 48. There are, of course, variations to this search method that may be made without departing from the invention; for example, the kernel could be incremented to the next column at the same level and then passed downwardly. After incrementing kernel 54 at block 100, the analysis continues to block 88.

Returning to interrogatory block 96, if the answer to the interrogatory is negative, kernel 54 is repositioned vertically by one increment at block 102. The process then proceeds with block 88.

If the gradient is greater than the gradient threshold (interrogatory box 94), the Y value at that location $(Y_i)$ is retained as indicated at block 104. Then the kernel window 54 is moved one tracking increment horizontally to the right in this example as indicated at block 106. The gradient for the kernel 54 is then calculated at the new position as indicated at block 108. The gradient is calculated at block 108 as previously described. At interrogatory block 110 the question is asked whether the newly calculated gradient is greater than the gradient threshold. If the gradient is greater than the gradient threshold, the process continues along path 112 to block 104 where the Y value for the new position is again retained. The loop defined by blocks 104, 106, 108, 110 and path 112 is continued as the kernel window tracks across the horizontal line segment, e.g., line segment 52.

Once the gradient for a new position as calculated at block 108 is no longer greater than a gradient threshold, the answer to the interrogatory at interrogatory box 110 will be in the negative and the process will continue to block 114. Block 114 specifies that a regression be performed on the Y values obtained in the above loop 104, 106, 108, 110 and 112, and block 116 specifies that the length $L_x$ be determined. The line length $L_x$ should be greater than a predetermined line length threshold as is the subject of interrogatory box 118.

If the line length, $L_x$, is greater than the length threshold the process continues to box 120. Box 120 specifies that the start and stop points and gradient for the line be saved, but other points may be saved as well. If the line length or magnitude is not greater than a line length threshold, the process continues at interrogatory box 122. Interrogatory box 122 asks whether a predetermined number of line segments have been saved as primitives. In aligning the template primitives and the image primitives, it is desirable to have a sufficient number of patterns to compare, and thus the question of box 122 is considered. If more than a predetermined number of line segments have been saved as primitives, the conversion of the digital image to image primitives may be considered complete at termination point 124. If fewer line segments have been saved as primitives than the predetermined number of line segments, the process continues at block 126. Block 126 indicates that the kernel window 54 is to return to the position where the tracking of the horizontal line segment 52 began and continue with the vertical scan of scope-of-view window 48 in search of horizontal line segments. Thus, the process continues by path 128 back to interrogatory box 96.

Referring to interrogatory box 98, the termination position for the scan or search for horizontal lines is reached, the answer to interrogatory box 98 will be affirmative and the process will continue to box 130. Box 130 indicates that a horizontal scan with kernel window 54 will be conducted looking for vertical line segments such as vertical line segment 50 in a manner analogous to the search that was done for horizontal lines as previously discussed. This scan for vertical lines is continued until all of the scope-of-view window 48 has been scanned for such lines or a predetermined number of line segments have been saved. If the scope-of-view window 48 is entirely scanned without reaching the predetermined number of line segments an arrow flag would normally be set. The process ends with termination point 132.

Figure 7:
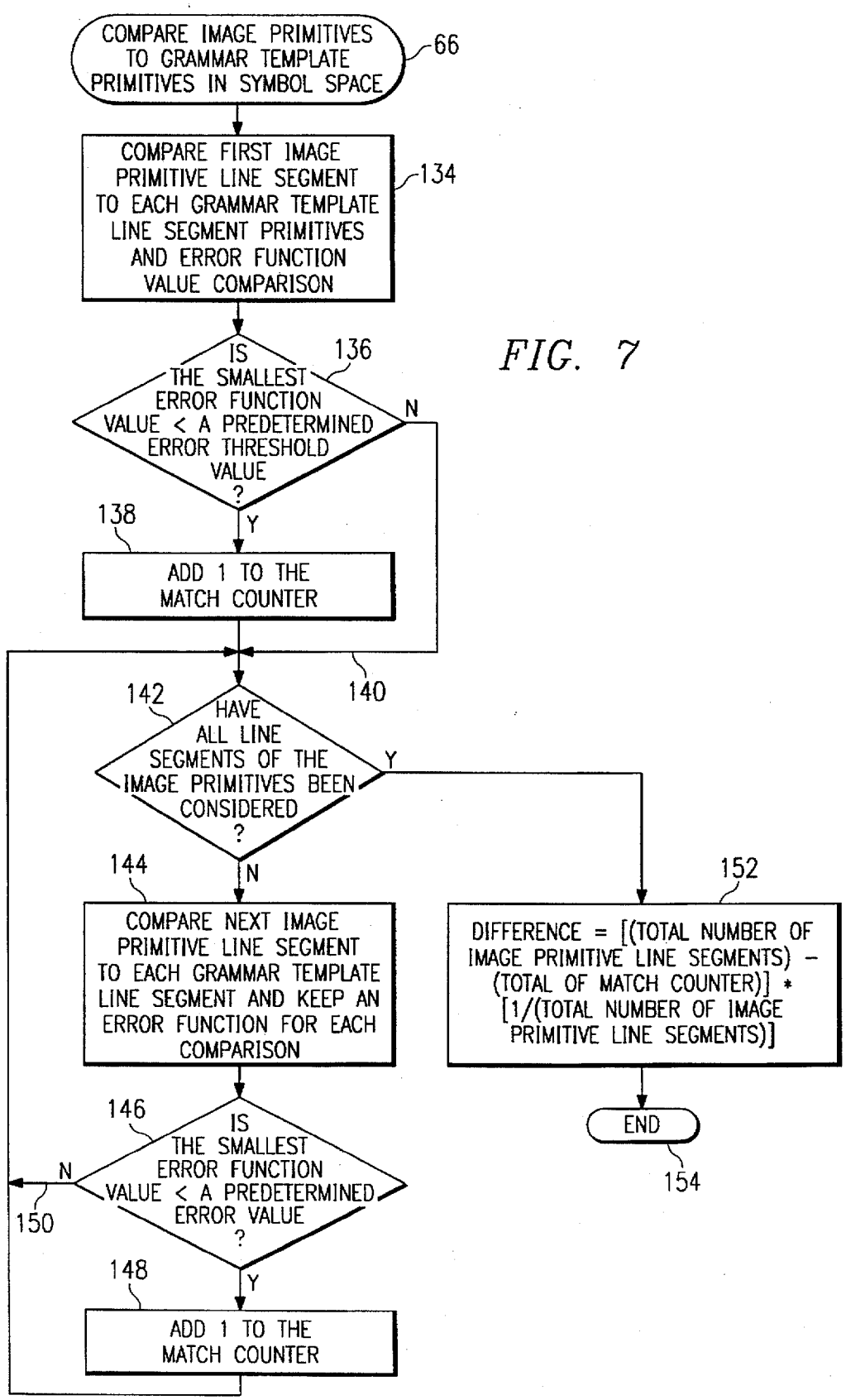
FIG. 7 is a block diagram showing one method for comparing image primitives to grammar template primitives in symbolic space according to the present invention.

Referring now to FIG. 7, there is shown one method of the present invention for comparing image primitives to grammar template primitives in symbolic space, but like the method described in connection with FIG. 6, there are numerous methods that could be used to carry out the invention of the present application. At the point where the process of FIG. 7 begins, a unique pattern (or patterns) for the particular device to be constructed on a wafer 20 has already been saved as grammar template primitives by which alignment can be based and the scope-of-view window 48 has been converted to image primitives (block 64). The image primitives consist of at least a predetermined number of line segments represented as at least two points, a length or magnitude, and the gradient. Beginning with block 134, the first image primitive line segment is compared to each of the grammar template line segment primitives while keeping an error function for each comparison. The error function value is a measure of how closely a given line segment matches another line segment. One approach for this error measurement is to consider the gradient and length of the lines. After the comparison of block 134, the question is asked at interrogatory box 136 whether the smallest error function value is less than a predetermined error threshold value. If the answer to the interrogatory at box 136 is affirmative, the number of matches is incremented by one at box 138. If the smallest error function value is greater than the predetermined error threshold, the process continues via path 140 to interrogatory box 142.

Interrogatory box 142 asks whether all the line segments of the image primitives have been considered. If not, block 144 specifies that the next image primitive line segment be compared to each line segment of the grammar template while keeping an error function value for each comparison as described previously. If in response to interrogatory box 146 it is determined that the smallest error function value is less than the predetermined error value, the match counter, which holds the number of matches, is incremented by one at block 148. Otherwise, the process continues along path 150 back to interrogatory box 142.

Eventually all the line segments of the image primitives will have been considered, and the answer to interrogatory box 142 will be affirmative. In that case, the process continues with box 152 where the difference between the image primitives and the grammar template primitives is quantified. The difference may be quantified by considering the total number of image primitive line segments less the number that matched all divided by the total number of image primitive line segments, i.e., the fraction of non-matches for the number considered. The comparison ends with determination point 154.

This technique of converting the video image to a digital image and then converting the digital image to primitives, which are form of representing the figure in symbolic space, generally allows for enhanced accuracy. This process is generally not unduly affected by digitization errors, ΔP. Consider for example, the line segment indicated by reference numeral 156 in FIG. 8a, which may be represented by the equation:

$$Y = ax + b \quad (4)$$

Figure 8A:
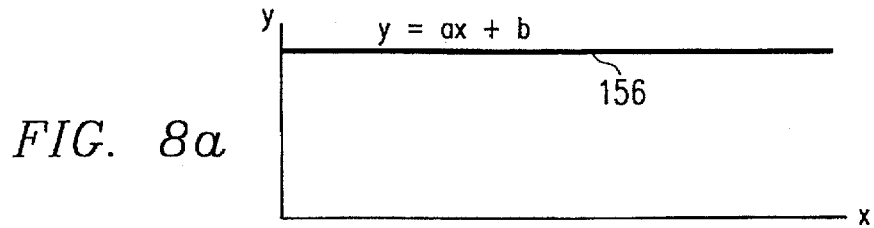
FIG. 8a is a schematic diagram of a line segment which is shown as a digitized line in FIG. 8b.
Figure 8B:
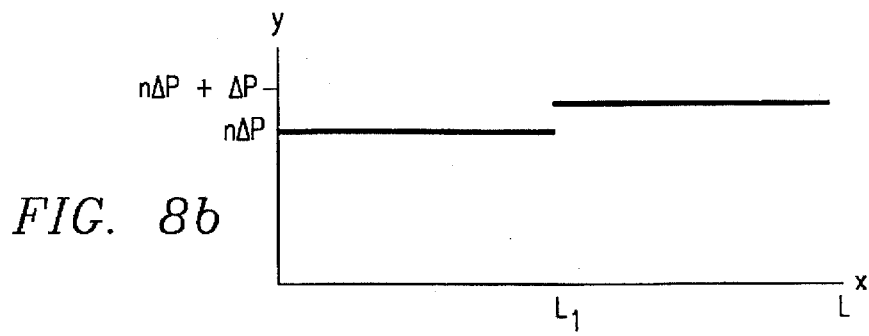
FIG. 8b is a schematic representation of the line segment shown in FIG. 8a after the line segment has been digitized with a digitization error ΔP.

FIG. 8b shows a portion of line 156 which has been digitized with a digitization error, ΔP. If for example the Y value for the line position as digitized is considered, the error can be compensated for in the processing of the digitized information. For example, the Y value, C, could be determined as follows:

$$C = \frac{1}{L} \sum_1 [ax_i + b] = \frac{1}{L} [N\Delta P \cdot L_1 + (n+1)\Delta P(L - L_1)] \quad (6)$$

The previously described alignment process can be conducted at several locations on wafer 20. For example, FIG. 2a shows five sample sites 41 that may be used to align wafer 20. The process would be carried out for each site as previously described.

Figure 9:
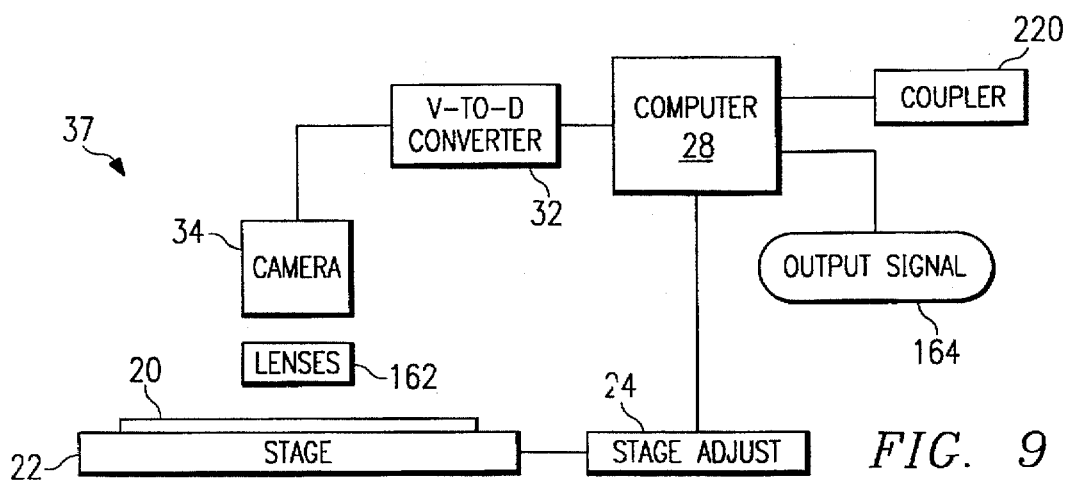
FIG. 9 is a schematic representation of a misregistration system of the present invention.
Figure 10:
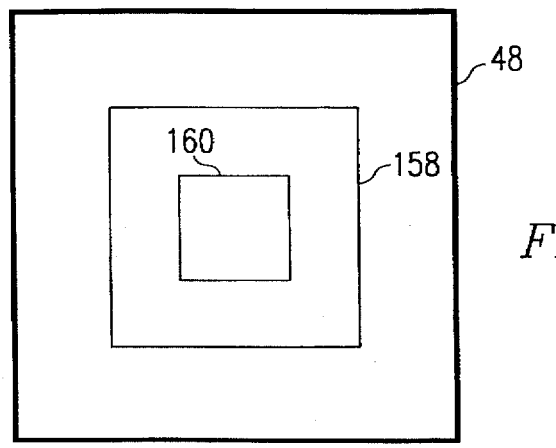
FIG. 10 is a schematic representation of a portion of a wafer showing two possible targets for use with the present invention.

In addition to aligning a fabrication tool 37 such as stepper projection system 34, the amount of misalignment or misregistration must frequently be determined. An apparatus according to one aspect of the present invention for determining misregistration is shown in FIG. 9. Wafer 20 rests on stage 22 which is movable in conjunction with stage adjustor 24. Stage adjustor 24 receives adjustment or correction output signals from computer 28. Computer 28 produces signals that adjust the stage 22 so that camera 34 produces a scope-of-view window 48 that is centered about a first target image 158 and a second target image 160 as shown in FIG. 10. The camera 34 typically views targets 158 and 160 on wafer 20 through a lensing system 162, and produces a video image signal which is delivered to video-to-digital converter 32, which produces a digital image which is delivered to computer 28. Computer 28 produces an output signal 164 which is indicative of the misregistration measurement. The output signal 164 may be coupled by a coupler 220 associated with computer 28 to other fabrication tools 37 so that before fabrication of other wafers 38 of a given lot, the fabrication tool 37 may be adjusted to correct some or all of the misregistration.

The misregistration check determines the alignment discrepancies between two layers. First target image 158 is placed on one layer of the wafer 20 and second target 160 is placed on a second layer to which a comparison is desired with the first layer. According to the present invention, the targets are converted to image primitives and compared in symbolic space.

Figure 11:
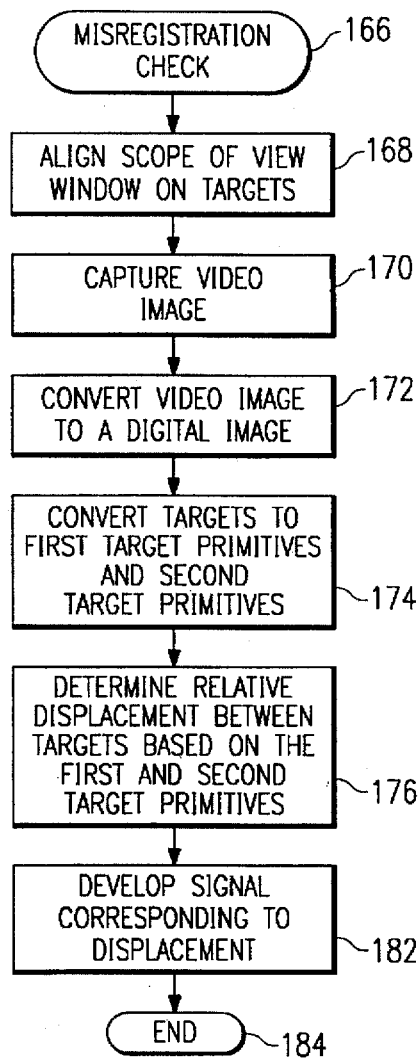
FIG. 11 is a block diagram showing one method of accomplishing a misregistration check according to the present invention.
Figure 12:
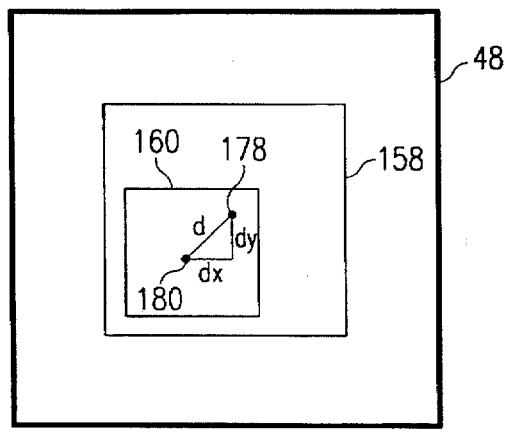
FIG. 12 is a schematic representation of a portion of a wafer showing two targets with a misregistration.

Referring to FIG. 11, one method for determining the misregistration is shown. The first step of the misregistration check (block 166) is to align the scope-of-view window 48 on targets 158 and 160 as indicated at block 168. This alignment is accomplished according to the alignment methods previously described. See FIG. 4. Once aligned or positioned, the contents of the scope-of-view window 48 is captured as a video image at block 170 by camera 34. The video image is then converted to a digital image at block 172 by a video-to-digital converter 32. The digital image is then converted to image primitives with first target primitives for the first target 158 and second target primitives for the second target 160 as indicated as block 174. The targets are converted to primitives in the fashion previously described. See FIG. 6.

The relative displacement between the first target 158 and the second target 160 is then determined by calculating the relative displacement of the first target primitives from the second target primitives in symbolic space (block 176). For example, if the first target image 158 is a box as shown in FIG. 10 and the second target image 160 is a box as shown in FIG. 10, the center of each box could be determined according to simple geometric techniques. Thus, referring to FIG. 12, the center of first target image 158 would be point 178 and the center of second target image 160 would be point 180. The relative displacement, e.g., dx and dy, can be determined based on the center points 178 and 180.

After computing the relative displacement between targets 158 and 160, an output signal may be developed corresponding to the displacement as indicated at block 182. The process of FIG. 11 terminates at block 184. The output signal produced at block 182 can be sent to other fabrication tools 37 through coupler 220 (FIG. 9) to compensate for the misregistration in subsequently processed wafers 20 of the same lot.

In another embodiment of the present invention, a character recognition system can be coupled to the metrology or fabrication tool 37. Such a character recognition system would read a unique identifier on wafer 20 so that the predetermined location of the alignment target and the grammar template primitives may be automatically located by the computer 28 from a database containing such information for various wafers.

In operation, the character recognition, alignment, and misregistration system could operate to allow the following. First a wafer could be placed on a stage 22 and the operator could indicate to computer 28 that it is ready to process. At this point, human intervention would typically not be required as the remaining steps would be automated. The optical character recognition system would first determine the unique identifier located on the wafer 38. The character recognition system could be any OCR system such as a convolution system. Having obtained the unique identifier for the wafer 20, the computer 28 can then look up the grammar template primitives for that particular wafer 20 and the predicted location of the alignment target. The computer 28 could then provide signals to stage adjuster 24 so that the stage moves wafer 20 to the initial position within a specified tolerance. The alignment technique previously described of converting an image to primitives and comparing it to the grammar template primitives to develop signals to use in conjunction with stage adjuster 24 can be used to align wafer 38. After aligning wafer 20, various processing steps can occur to the wafer such as producing a new layer. The registration of the new layer versus the previous layer or wafer 20 can then be determined with the misregistration check previously described.

Although the present invention and its advantages have been described in detail, it should be understood that various changes, substitutions and alterations can be made therein without departing from the spirit and scope of the invention as defined by the appended claims.

What is claimed is:

1. A method for aligning a wafer in a fabrication tool with a template, comprising the steps of:

placing the wafer on a moveable stage of the tool;

positioning the wafer so that a camera on the tool can capture a scope-of-view window at a specified location;

capturing a video image with the camera;

converting the video image to a digital image;

converting the digital image to image primitives where each image primitive defines a line segment trace of said video image along an intensity level by one or more points and a magnitude;

said step of converting the digital image to image primitives comprises locating horizontal line segments by:
  (i) passing a kernel vertically until a gradient with a magnitude greater than a gradient threshold is located;
  (ii) passing the kernel approximately horizontally to track the horizontal gradient;
  (iii) saving at least two points along the line and the magnitude of the gradient; and
  (iv) repeating steps (i) through (iii) for the scope-of-view window;

comparing the image primitives to grammar template primitives where each grammar template primitive defines a line segment trace of a reference image along an intensity level by one or more points and a magnitude;

determining the displacement of the video image from the template by determining the displacement of the image primitives from the template primitives;

developing correction signals from the difference in displacement; and aligning the wafer in response to the correction signals.

2. A method for aligning a wafer in a fabrication tool with a template, comprising the steps of:

placing the wafer on a moveable stage of the tool;

positioning the wafer so that a camera on the tool can capture a scope-of-view window at a specified location;

capturing a video image with the camera;

converting the video image to a digital image;

converting the digital image to image primitives where each image primitive defines a line segment trace of said video image along an intensity level by one or more points and a magnitude;

said step of converting the digital image to image primitives comprises locating the vertical line segments by:
  (i) passing a kernel horizontally until a gradient with a magnitude greater than a gradient threshold is located;
  (ii) passing the kernel approximately vertically to track the vertical gradient;
  (iii) saving at least two points along the line and the magnitude of the gradient; and
  (iv) repeating steps (i) through (iii) for the scope-of-view window;

comparing the image primitives to grammar template primitives where each grammar template primitive defines a line segment trace of a reference image along an intensity level by one or more points and a magnitude;

determining the displacement of the video image from the template by determining the displacement of the image primitives from the template primitives;

developing correction signals from the difference in displacement; and aligning the wafer in response to the correction signals.

3. A method for aligning a wafer in a fabrication tool with a template, comprising the steps of:

placing the wafer on a moveable stage of the tool;

positioning the wafer so that a camera on the tool can capture a scope-of-view window at a specified location;

capturing a video image with the camera;

converting the video image to a digital image;

converting the digital image to orthogonal image primitives where each image primitive defines a line segment trace of said video image along an intensity level by one or more points and a magnitude;

said step of converting the digital image to image primitives comprises:
  (a) locating horizontal line segments by:
    (i) passing a kernel vertically until a gradient with a magnitude greater than a gradient threshold is located;
    (ii) passing the kernel approximately horizontally to track the gradient;
    (iii) performing linear regression for the points along the line segment;
    (iv) saving at least two points along the line and the magnitude of the gradient; and
    (v) repeating steps (i) through (iv) of (a) for the scope-of-view window; and
  (b) locating the vertical line segments by:
    (i) passing a kernel horizontally until a gradient with a magnitude greater than a gradient threshold is located;
    (ii) passing the kernel approximately vertically to track the gradient;
    (iii) performing linear regression for the points along the line segment;
    (iv) saving at least two points along the line and the magnitude of the gradient; and
    (v) repeating steps (i) through (iv) of (b) for the scope-of-view window;

comparing the orthogonal image primitives to orthogonal grammar template primitives where each grammar template primitive defines a line segment trace of a reference image along an intensity level by one or more points and a magnitude;

determining the displacement of the video image from the template by determining the displacement of the orthogonal image primitives from the orthogonal template primitives;

developing correction signals from the difference in displacement; and aligning the wafer in response to the correction signals.

* * * * *